United States Patent [19]
Gruodis et al.

[11] Patent Number: 5,412,665
[45] Date of Patent: May 2, 1995

[54] PARALLEL OPERATION LINEAR FEEDBACK SHIFT REGISTER

[75] Inventors: Algirdas J. Gruodis, Wappingers Falls; Piyushkumar C. Patel, Poughkeepsie, both of N.Y.; Kurt P. Szabo, Austin, Tex.

[73] Assignee: International Business Machines Corporation, Armonk, N.Y.

[21] Appl. No.: 819,438

[22] Filed: Jan. 10, 1992

[51] Int. Cl.$^6$ .......................................... G01R 31/3183
[52] U.S. Cl. ...................... 371/27; 371/20.4; 324/73.1
[58] Field of Search ............... 371/22.4, 27, 20.1, 371/20.4, 20.5, 22.1, 22.3, 22.5; 324/73, 158 R

[56] References Cited

U.S. PATENT DOCUMENTS

| | | | |
|---|---|---|---|
| 3,614,608 | 10/1971 | Giedd et al. | 324/73 R |
| 3,719,885 | 3/1973 | Carpenter et al. | 324/73 R |
| 3,976,864 | 8/1976 | Gordon et al. | 235/153 |
| 4,503,537 | 3/1985 | McAnney | 371/25 |
| 4,519,078 | 5/1985 | Komonytsky | 371/27 |
| 4,547,861 | 10/1985 | Laviron et al. | 371/27 |
| 4,594,711 | 6/1986 | Thatte | 371/22.4 |
| 4,598,401 | 7/1986 | Whelan | 371/25 |
| 4,601,033 | 7/1986 | Whelan | 371/25 |
| 4,601,034 | 7/1986 | Sridhar | 371/25 R |
| 4,764,926 | 8/1988 | Knight et al. | 371/27 |
| 4,771,429 | 9/1988 | Davis et al. | 371/27 |
| 4,801,870 | 1/1989 | Eichelberger et al. | 324/73 R |
| 4,825,397 | 4/1989 | Muller | 364/724.17 |
| 4,959,832 | 9/1990 | Bardell | 371/27 |
| 4,975,640 | 12/1990 | Lipp | 324/158 R |
| 5,258,986 | 11/1993 | Zerbe | 371/27 |

OTHER PUBLICATIONS

IBM Technical Disclosure Bulletin, vol. 29, No. 1, pp. 114–119, Jun. 1986, W. K. Chui, "High Speed Parallel Signature Board."

IBM Technical Disclosure Bulletin, vol. 26, No. 12, pp. 6358–6360, May 1984, B. P. Fenton et al., "Multiple--Line Signature Analysis Using Parallel Linear Feedback Shift Register."

*Primary Examiner*—Emanuel T. Voeltz
*Assistant Examiner*—Kyle J. Choi
*Attorney, Agent, or Firm*—H. Daniel Schnurmann

[57] ABSTRACT

A parallel operation linear feedback shift-register (LFSR) that generates random test patterns or creates a signature that represents the response of a device under test at ultra high speed using low speed components and/or a slow rate clock. The apparatus is comprised of: a register connected to an external clock, and a plurality of combinatorial logic networks sequentially connected, the last of which drives the register which in turn feeds back into the first of the combinatorial logic networks. Each of the combinatorial networks provides a pseudo-random pattern which are then outputted in parallel, thereby creating a high speed data flow. By providing additional data inputs to the combinatorial networks, the pseudo-random patterns become the signature of the input data.

19 Claims, 7 Drawing Sheets

FIG. 1 PRIOR ART LFSR

FIG. 2  PRIOR ART LFSR OF FIG. 1 MODIFIED FOR NON-GATED CLOCK OPERATION

BLOCK FORM REPRESENTATION OF
FIG. 2 LFSR

FIG. 3

FIG. 4  WEIGHTED RANDOM PATTERN GENERATOR AND SINGLE INPUT SIGNATURE REGISTER USING POLFSR

FIG. 5

PRIOR ART MULTIPLE INPUT SHIFT REGISTER

FIG. 6  XOR NETWORK 70 FROM FIG. 2 MODIFIED FOR MULTIPLE DATA IN.

FIG. 7 UNIVERSAL POLFSR THAT CAN BE USED AS A PO MISR OR AS A WORD GENERATOR

PARALLEL OPERATION LINEAR FEEDBACK SHIFT REGISTER

FIELD OF THE INVENTION

This invention relates to a linear feedback shift-register (LFSR) and in particular to an LFSR that generates random test patterns at high speed.

BACKGROUND OF THE INVENTION

Linear feedback shift-register (LFSR) circuits have long been known to create random test data for complex very large scale integrated (VLSI) circuits containing many thousands of interconnected circuits, most of which are inaccessible for testing purposes. Because of the complexity of the internal interconnections and their interdependencies, detecting the presence of defective elements is difficult and time consuming.

By way of example, a semiconductor chip with fifty input terminals would require a total of $2^{50}$ binary input combinations. Applying such a large number of inputs patterns during testing, followed by reading the corresponding output responses and, finally, comparing these responses with expected values obtained from simulation is an impossible task.

Giedd et al, in U.S. Pat. No. 3,614,608 describes a random number generator used for automatically generating test vectors. This generator considerably reduces the number of test patterns required to test a circuit. This reduction is possible because a random pattern generator, unlike a binary test generator, produces a succession of binary words, wherein the split between "0"s and "1"s approaches 50% for a substantial number of successive words. Each input to the device under test has a 50% chance of receiving a "0" or a "1" with far fewer number of input patterns.

Pure random pattern generators have been modified over the years to reduce test time. A technique designed to introduce a certain degree of intelligence to test pattern generation is described in U.S. Pat. No. 3,719,885 to R. G. Carpenter et al. This method, known as Weighted Random Pattern (WRP) generation, consists of creating a statistically predetermined greater number of "0"s or "1"s which are then applied to the Device Under Test (DUT). These WRP are far more efficient in accessing internal circuit elements within the DUT than flat random patterns.

A further improvement over Giedd and Carpenter is described in U.S. Pat. No. 4,801,870 to E. B. Eichelberger et al. A method and apparatus for testing VLSI circuits and more particularly, a Level Sensitive Scan Design (LSSD) is described, in which differently configured sequences of random patterns are applied in parallel to each input terminal of the DUT. Output responses are then collected from each output in parallel and combined so as to obtain a signature function of all of the sequences of parallel outputs. Ultimately, the test signature is compared with a known good "signature" obtained by computer simulation. This use of "signatures" in lieu of comparing each individual test response with a known good output response is taught by Gordon et al in U.S. Pat. No. 3,976,864.

Several variations of signature analyzers have been described. By way of example, Th. Sridhar discloses in U.S. Pat. No. 4,601,034 a configurable parallel signature analyzer used for testing high density VLSI memory elements. In another version, fully described in the IBM Technical Disclosure Bulletin, Vol. 29, No. 1, June 1986, W. K. Chui shows a High Speed Parallel Signature Board that converts eight different digital data streams into eight independent 16-bit signatures simultaneously. In yet another variation of a signature analyzer, B. P. Fenton et al show in the IBM Technical Disclosure Bulletin, Vol. 26, No. 12, May 1986, how to obtain multiple line signature analysis by using parallel LFSRs to test logic circuit at functional speeds.

LFSRs have also produced signatures at the outputs of a DUT to represent current states in dependence upon prior states and received response signals. This is achieved by allowing checking to occur during testing in contrast to conventional signature analysis, wherein comparison only occurs at the end of a testing sequence. Such apparatus is disclosed by M. Whelan in U.S. Pat. No. 4,601,033.

Classic LFSRs, as those described in the cited references, are sequential. Binary values are shifted from one shift-register stage to the next by a clock until they eventually exit via an LFSR output. It is well known that sequential operations are slow in nature and must therefore be compensated by running the LFSR at high speeds to achieve the necessary data generation and compression rates which are the norm of WRP generators. For high end systems, high speed data generation and compression can only be achieved by high performance circuits and a high speed clock. High speed circuits also require more power and extra cooling, both of which take up considerably more space in the system than that needed in an implementation with low performance circuitry such as CMOS, instead of bipolar technology.

OBJECTS OF THE INVENTION

Accordingly, it is an object of the present invention to generate random test data at ultra high speed.

It is another object of the invention to increase the speed of generating a signature from test responses.

It is still another object of the invention to use a slow clock rate and slower technology components to achieve results characteristic of faster and costlier technologies.

It is yet another object of the invention to generate test data while maintaining reduced system power and power distribution, lower cost and increased system reliability.

It is a further object of the invention to provide a reconfigurable LFSR which is expandable and controllable.

It is a more particular object of the invention to inhibit any changes in data within the LFSR from occurring.

It is yet a further object of the invention to provide parallel capabilities to any flat or weighted pseudo-random pattern generator, signal analyzers, MISRs, and to any LFSR of any design.

SUMMARY OF THE INVENTION

The aforementioned objects are achieved according to the present invention, which is an LFSR for generating random test patterns or a signature from a data source at ultra high speed using low speed circuit components and a slow clock rate comprising: a latch register comprising a plurality of latches for storing test data, each latch is driven by an external clock; a plurality of sequentially connected combinatorial logic networks, one of the networks driving the latch register, the latch register, in turn, driving a second of the networks; and parallel driving means for driving a parallel pattern at an output bus from the patterns generated by the logic networks.

BRIEF DESCRIPTION OF THE DRAWINGS

Other objects, features and advantages of the present invention will become more fully apparent from consideration of the following detailed description of the preferred embodiment and the appended Figures in which.

DESCRIPTION OF THE PREFERRED EMBODIMENT

Figure 1:
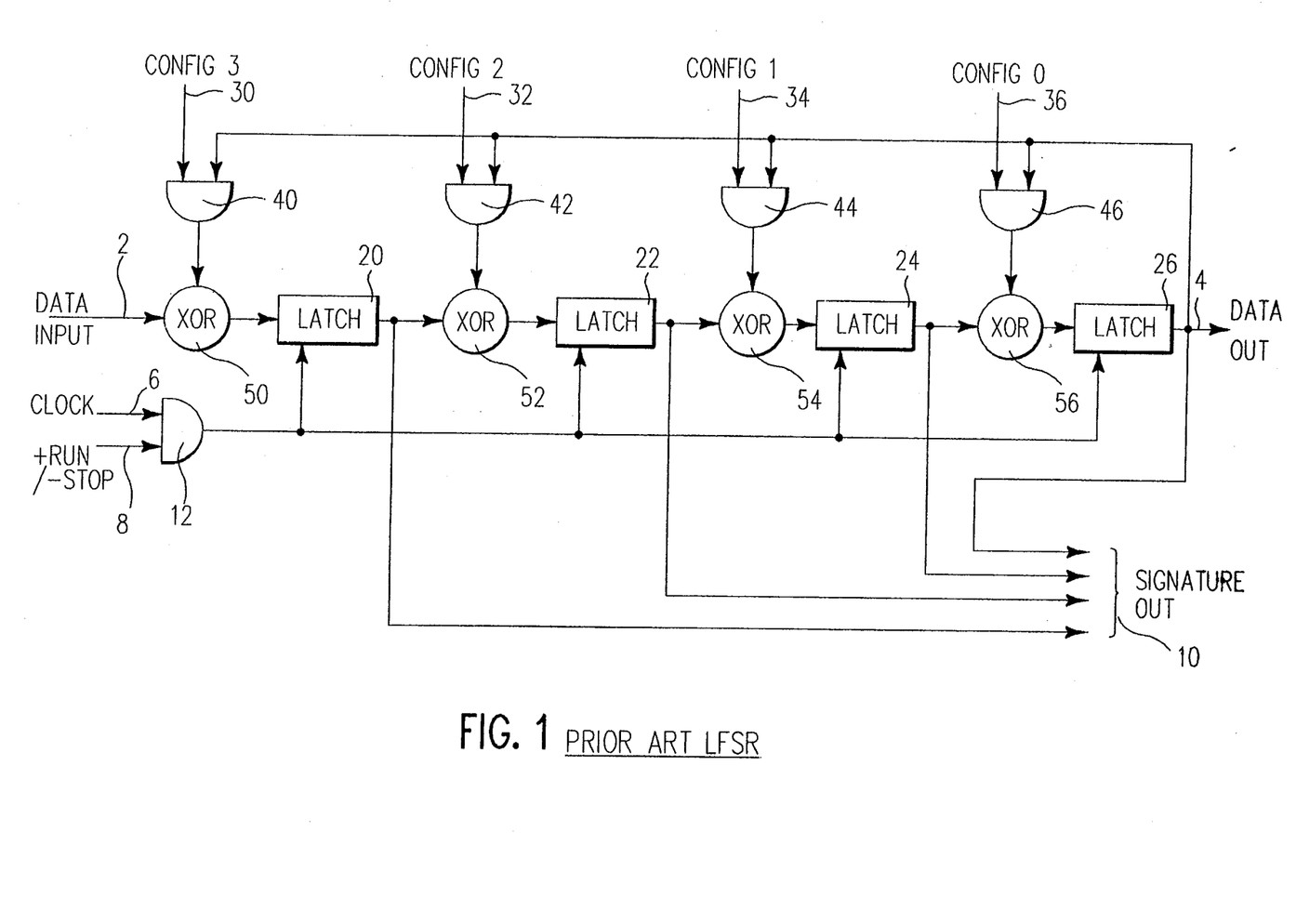
FIG. 1 is a schematic diagram of a prior art LFSR run by a gated clock.

Reviewing first some pertinent principles that govern LFSRs, FIG. 1 shows a prior art sequential LFSR comprised of 4 shift-register (SR) stages (latches 20, 22, 24, and 26) which inputs are controlled by XOR (exclusive-OR) gates (50, 52, 54, and 56), respectively. To produce a pseudo-random pattern, the output 4 of the last stage 26 is fed back into each of the previous SR stages. The presence or absence of a feedback path in the LFSR chain is controlled by an AND gate (40, 42, 44, and 46) each of which is provided with a second input tied to a configuration tap (30, 32, 34, and 36), respectively. If configuration bits on lines 30 and 32 are both at "0", and lines 34 and 36 are both at "1", AND gates 40 and 42 will be off while AND gates 44 and 46 will be on, (provided output 4 is at a "1" during that clock cycle). Thus, XOR gates 50 and 52 merely allow the transfer of the bits of data input 2 unaltered through latches 20 and 22 into XOR 54, as if no feedback tap from data output 4 was ever present. Conversely, outputs of XORs 54 and 56 will depend on the binary value of output 4, via AND gates 44 and 46, thereby modifying the value to be stored in latches 24 and 26.

At time t0, the LFSR is initially loaded with a non-zero pattern, with each bit stored in one of the latches comprising the LFSR. As the latches are clocked through each subsequent clock cycle, each bit is correspondingly shifted from one SR stage to the next. The feedback output from the last stage of the LFSR determines whether the data is modified as it propagates from one SR stage to the next.

Figure 2:
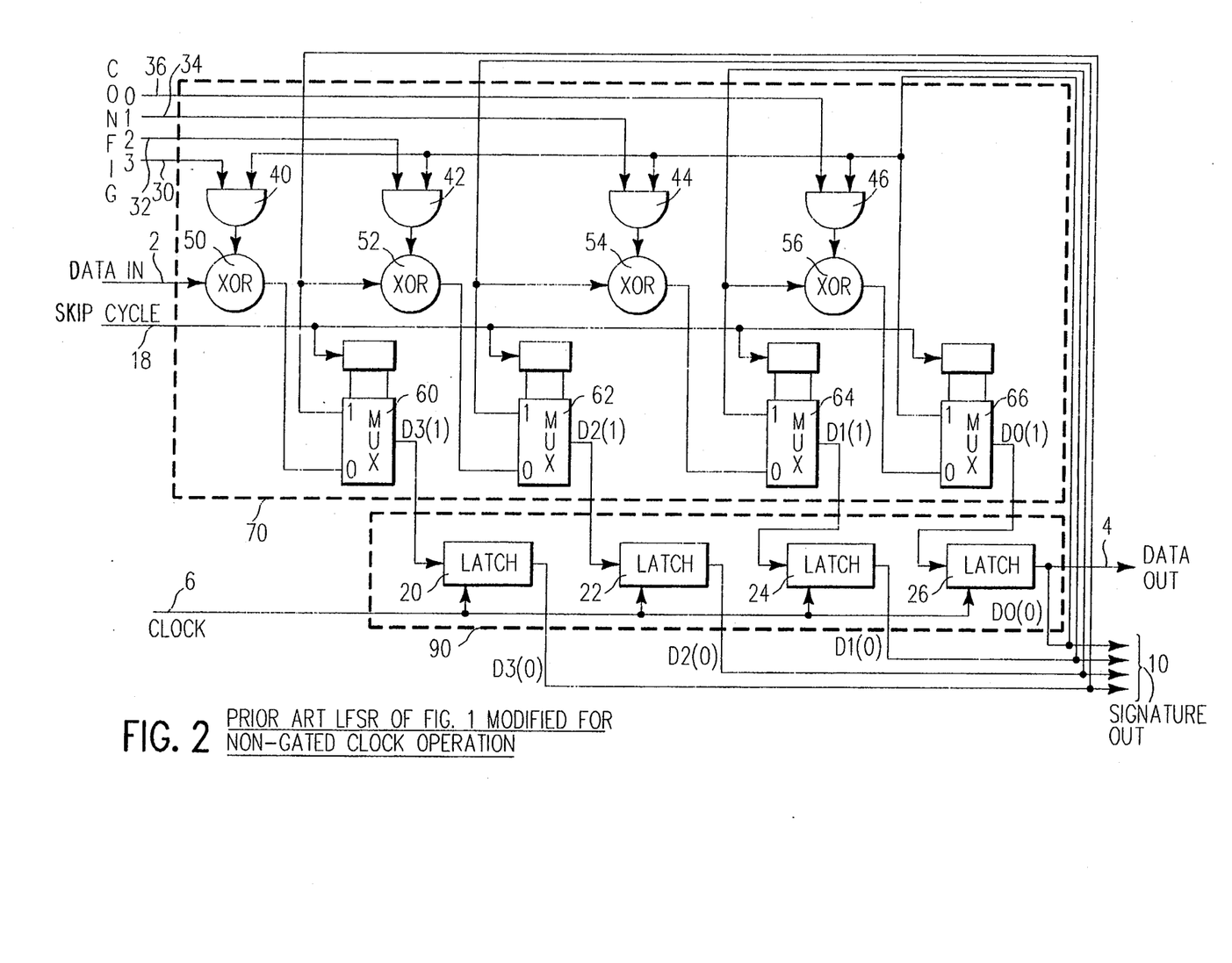
FIG. 2 is a schematic diagram of a prior art LFSR with a non-gated free running clock, in accordance with the present invention.

Referring now to FIG. 2, an LFSR controlled by a non-gated free running clock operation is shown. Generally, the start and stop operation of an LFSR can be achieved by gating the clock on and off. In many applications, however, particularly in high speed applications, it is oftentimes desirable to distribute a clock without gating, thereby allowing the clock to run continuously. By way of example, clock 6 in FIG. 1 is gated by AND gate 12 which is also controlled by Stop/Run input 8. As in FIG. 2, clock 6 can run continuously.

The N data latches 20, 22, 24, and 26 can generally be viewed as a data latch shift register 90 with a common clock 91 and N data inputs D0(1), D1(1), D2(1), and D3(1). The remainder of the logic is comprised of: N AND gates 40, 42, 44, and 46 to control the configuration of the LFSR, N XORs 50, 52, 54, and 56 to provide means for appropriately modifying the data as it propagates from one SR stage to the next, and N 2-way multiplexers (MUXs) 60, 62, 64, and 66 to allow the LFSR preserve its state while the clock is running. The XOR network 70 consisting of a combination of MUXs, XORs and AND gates, is controlled by input signal 2, skip cycle line 18, N control lines 30, 32, 34, and 36, which are referred to as configuration lines, and inputs from the data latch shift register D0(0), D1(0), D2(0), and D3(0), that represent the present status of the LFSR. The XOR network 70 takes the present output state D(0) of the LFSR and subsequently changes it to the next output state D(1).

To further understand the operation of the modified LFSR in accordance with the present invention, let any intermediate stage be selected for further analysis. By way of example, let latch 22, MUX 62, XOR circuit 52, and AND gate 42 be considered as a single stage of the LFSR. The output of this stage produces the bit D2 of the signature which is comprised of bits D0, D1, D2, and D3. The initial status of all bits and more particularly of bit D2 is referred to as D2(0). Upon application of the clock signal, the output D2 will equal the data at the input D2(1) to latch 22. If the output of the latches is to remain unaltered during the application of clock 6, the control input to the MUX (i.e., Skip Cycle 18) is raised to a "1" such that the upper input D2(0) of MUX 62 becomes the output D2(1) of that MUX. Thus, the state of latch 22 is held constant without intervention from the clock 6. If, on the other hand, Skip Cycle 18 is held at a "0", the lower input from MUX 62 becomes activated. Note should be made that the inputs of XOR 52 are connected to the output D3(0) of the previous stage and to the output of configuration control AND gate 42. Thus, when Skip Cycle equals "0", the operation of the modified LFSR is identical to the prior art LFSR shown in FIG. 1.

The first stage of the LFSR comprised of latch 20, MUX 60, XOR 50 and AND gate 40 is similar to the previously described intermediate stage. A significant distinction is that the input to XOR 50 is connected to an external input data source. This external input source is the signal which signature the LFSR is to determine. If the LFSR is used for test pattern generation, this input is held at a constant level usually, but not necessarily, "0".

The final stage of the LFSR in accordance to the present invention is comprised of latch 26, MUX 66, XOR 56 and AND gate 46. It is identical to the intermediate stage previously described. Its output D0(0), however, not only feeds MUX 66 but it also simultaneously feeds all the configuration AND gates to provide the required feedback. If the LFSR is used as a flat pseudo-random pattern generator, it is normally this final stage that is used as the pattern generator output.

It must be noted at this point that the LFSR must be initialized, a process normally referred to as seeding. For the LFSRs shown in FIGS. 1 and 2, seeding is accomplished by setting the Config bits to "0", +Run/−Stop to "1" (or Skip Cycle to "0"), and feeding the desired seed pattern serially into the line Data-In 2.

In an alternate embodiment, the LFSR is seeded by providing an alternate input to all the latches in parallel and loading the desired seed within a single application of the clock.

It is worth noting that the XOR Network 70 has the present LFSR state D(0) (consisting of bits D0(0), D1(0), D2(0), and D3(0)) as input and produces the next LFSR state D(1) (consisting of bits D0(1), D1(1), D2(1), and D3(1)) as output. When the LFSR is to act as a signature analyzer, the additional input, Data-In 2, is connected to the source of pattern data whose signature is to be generated. In an electronic tester, this requires connecting it to the output terminal of the DUT by means of an appropriate receiver. The Configur bus is normally held at a fixed level during testing and is used to activate the desired feedback paths. The Skip Cycle control is used whenever a state in the LFSR is to be preserved from one clock cycle to the next. This is equivalent to gating the clock off in the prior art LFSR of FIG. 1.

Figure 3:
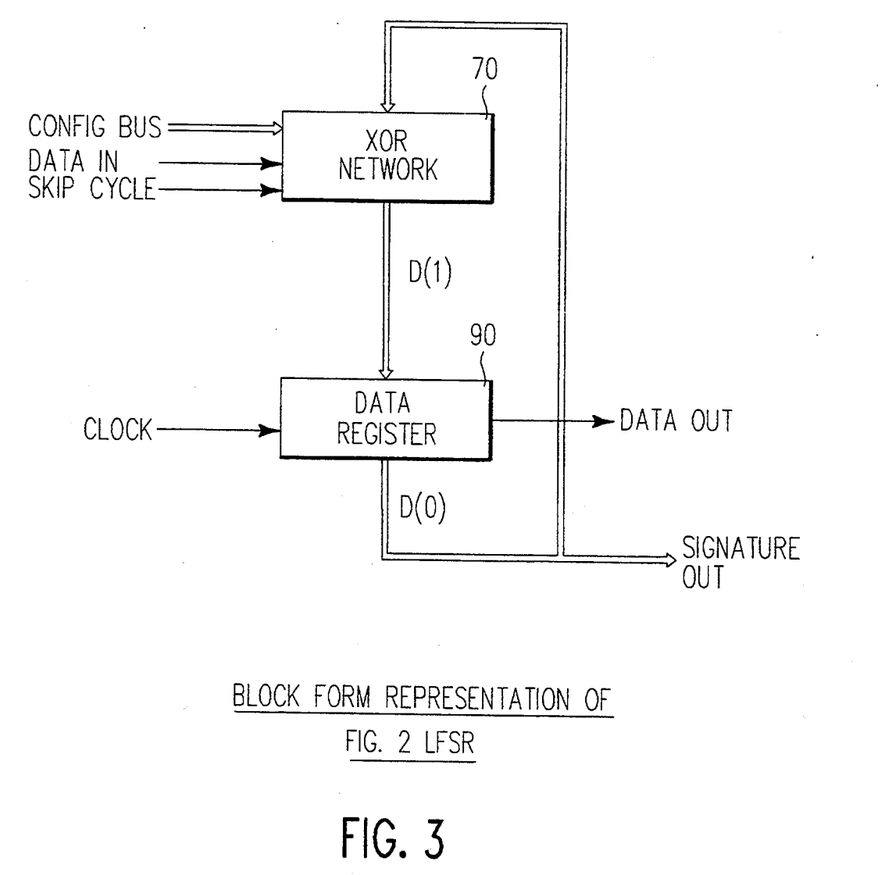
FIG. 3 is a block diagram of the LFSR shown in FIG. 2.

Referring now to FIG. 3, the LFSR shown in FIG. 2 may schematically be represented by a block representation in which the length of the LFSR comprised of N stages is generally much longer than the LFSR shown in FIG. 2. In fact, because random patterns repeat themselves after $2^N-1$ cycles, most common designs have N equal to 16 or 32; however, any number of stages is acceptable.

The XOR Network 70 modifies the present state of the LFSR to provide the next state. It is, thus, possible to place a plurality of XOR Network stages in series and correspondingly generate plural output states to be used in parallel. This is illustrated in FIG. 4, the preferred embodiment, in which a schematic diagram of the parallel operation LFSR with M=4 parallel factors (POLSFR) is shown in accordance with the present invention.

The XOR Network 70 takes the present state D(0) and changes it to the next state D(1). XOR Network 71 then takes D(1) and likewise changes it to the next state, namely, D(2). This process continues until the XOR Network 73 produces an output D(4) which is equivalent to the state of the prior art LFSR shown in FIG. 1, but four cycles later. The POLSFR accomplishes the same results in just one cycle. It becomes thus apparent from the previous discussion that every clock cycle of the modified configuration generates four cycles of the original sequential LFSR configuration. This process can be generalized to an M XOR Network POLFSR which effectively multiplies the rate of operation of the circuit M-fold. By using latches that have a low maximum clock rate (perhaps M times as slow) one may still produce data that is equivalent to the fast clock of the state of the art LFSR previously described. By way of illustration, one may construct a 32 bit LFSR using a technology having a maximum clock rate of 31.25 Mhz and yet produce sufficient data to operate a tester running at 250 Mhz.

Figure 4:
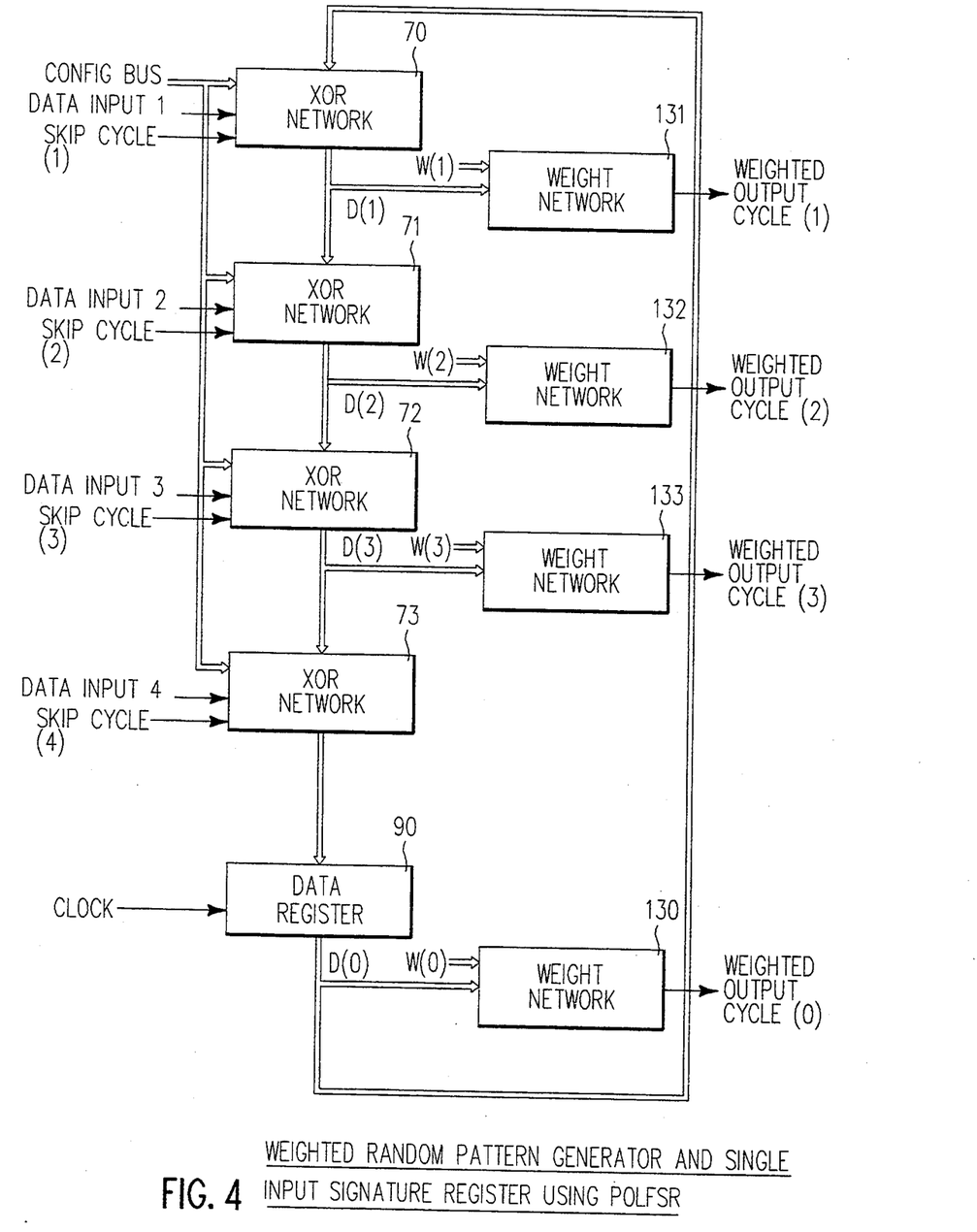
FIG. 4 shows a block representation of a 4-input, 4-output parallel operation LFSR (POLFSR) modified as a WRP generator and single input signature register, in accordance with the present invention.

By holding data inputs 1-4 at a fixed level, the POLFSR of FIG. 4 can be used to generate pseudo-random patterns which may be applied to the DUT. It is worth noting that any one line of the "signature" can be used as data out. Likewise, by applying the DUT response data in sequence to the data inputs 1-4, the POLSFR of FIG. 4 can be used as a single input signature register (SISR).

It is well known to practitioners in the art, that to convert an LFSR to a Weighted Random Pattern (WRP) generator, the procedure generally used is to select several output bits from the LFSR and ANDing or ORing them together so as to increase or decrease the probability of "0"s over "1"s that occurs during test. Since each input has a probability of 0.5 to be a "0" or a "1", a 2-way AND gate of two random bits will have a probability of 0.75 of a "0" over a "1" (or of 0.25 of a "1" over a "0"). A 3-way AND gate will increase the probability to 0.875, etc. Having several different outputs generated by different size AND or OR circuits, the probabilities for a "1" or "0" can appropriately be modified by feeding these bits into an output selector circuit (or MUX). Thus, the outputs of the LFSR become "weighted". The circuit arrangement comprised of AND and OR gates in combination with the output selectors is referred to as the Weighting Network.

Weighting can either be fixed for the duration of the test or altered on a cycle by cycle basis by providing the required weight information which is likewise fixed or modified on a cycle by cycle basis. In some cases, the weight is changed after an interval of test patterns.

To adequately achieve an appropriate weight adjustment on a cycle by cycle basis, the POLFSR has a plurality of weighting networks 130, 131, 132, and 133, each of which is attached to a separate output of the POLFSR (i.e., D(0), . . . , D(3)). However, unlike the configuration bits which remain unchanged for the duration of the test and can therefore be all attached together, the weighting networks are individually controlled to allow each cycle to have a different weight W(0), . . . , W(M-1).

Figure 5:
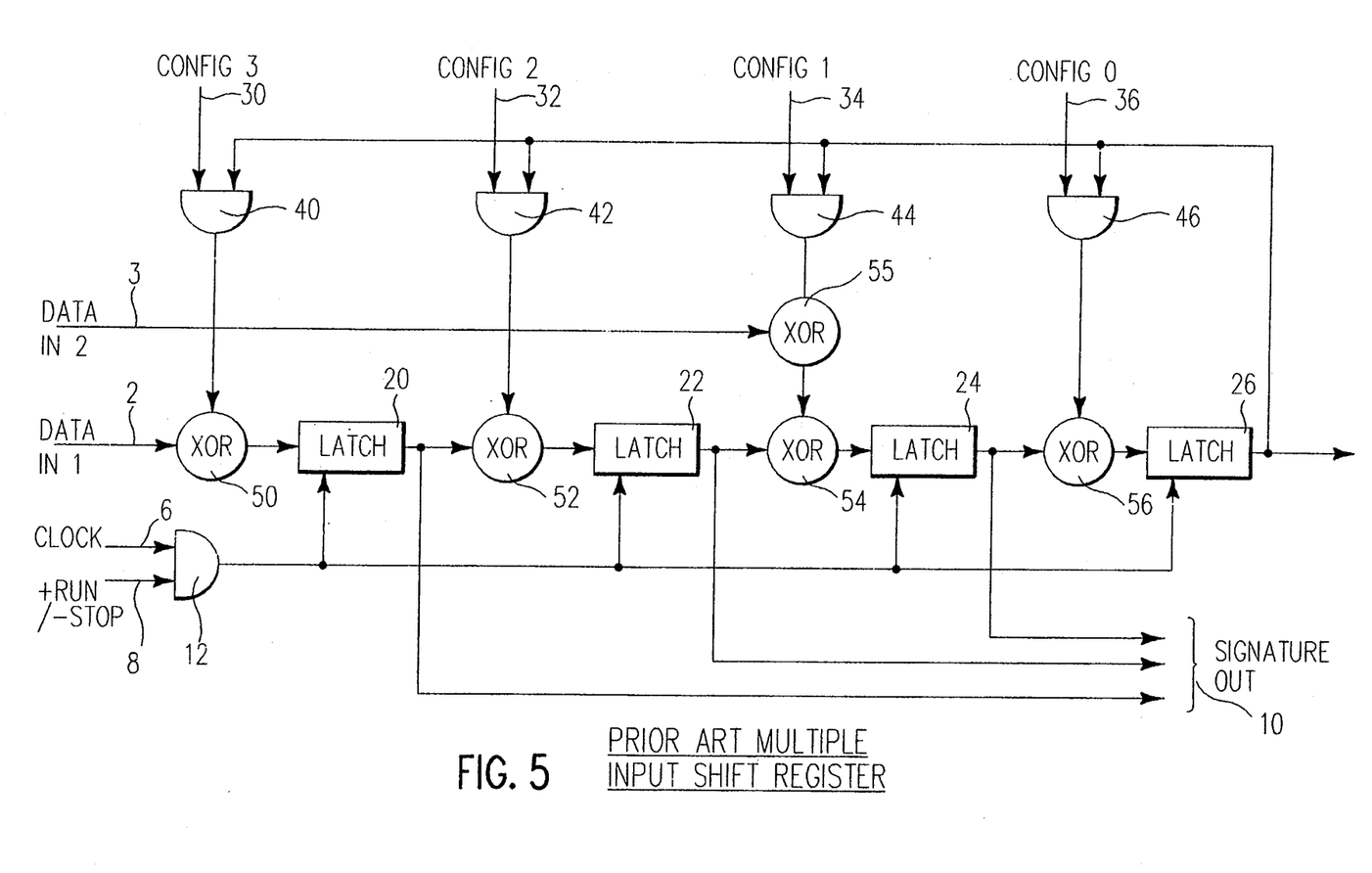
FIG. 5 shows a block diagram of a prior art Multiple Input Shift Register (MISR) controlled by gated clock.

Sometimes it is desirable to have more then one input source of patterns for signature analysis. This type of LFSR is known as a Multiple Input Shift (or Signature) Register (MISR). FIG. 5 is an illustration of a prior art, 2-input MISR. In general, the multiple inputs are connected to specific stages to maximize the separation between them, remembering that the last stage of the LFSR feeds the first stage. For the case of the four stage LFSR as illustrated in FIG. 5, the second input is connected to the stage that is two stages away from the first input. This is desirable but not necessary since any stage could have been modified for the second input. Generally, the same result may be achieved by intercepting the feedback loop from the last stage to the stage being modified, preferably, by an additional XOR (in this case, XOR 55). In a previous discussion of the prior art LFSR, XOR 55 is combined with XOR 54 and is referred to as a three input XOR.

Figure 6:
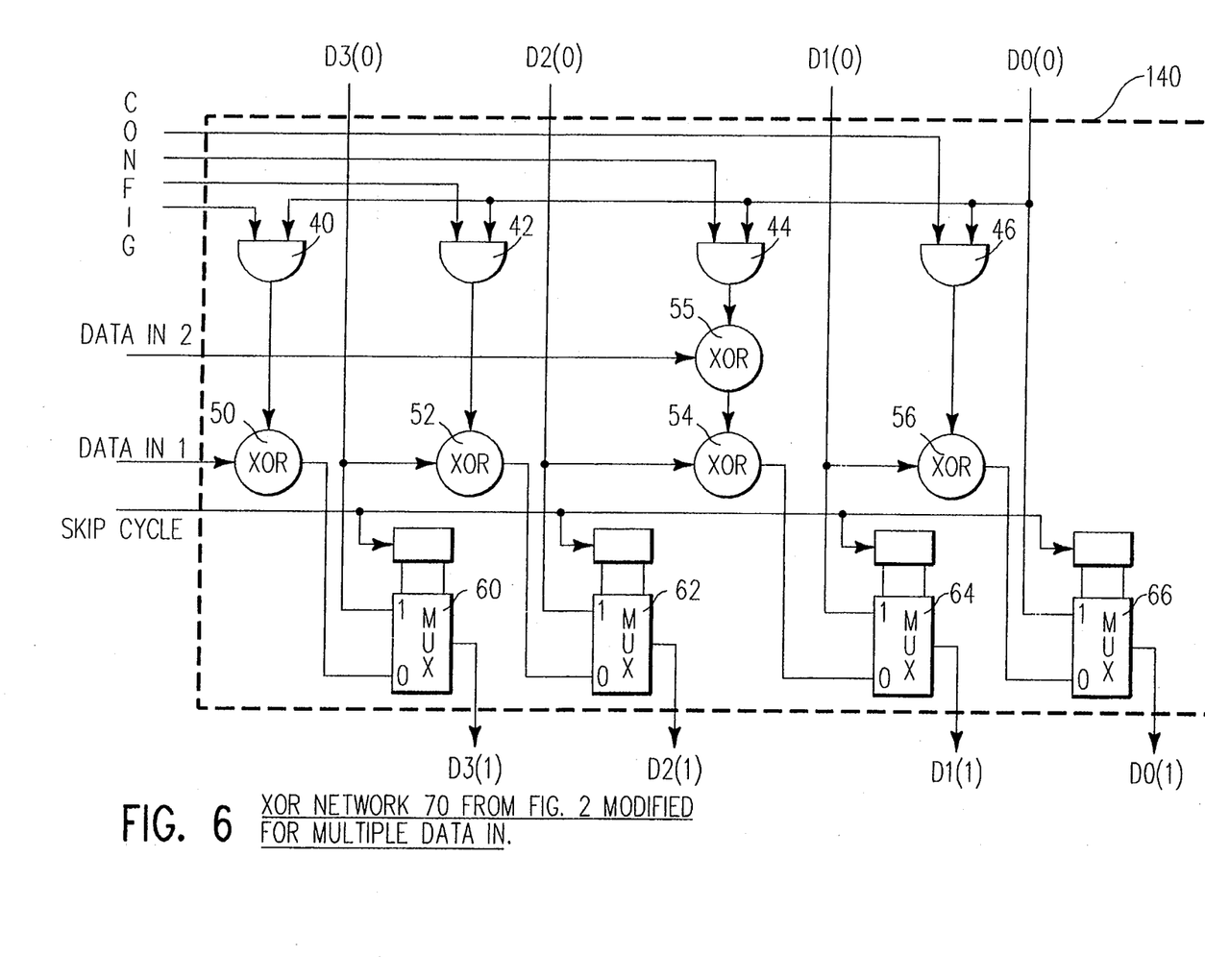
FIG. 6 is a block diagram of the XOR Network of FIG. 2 modified for multiple data input.

FIG. 6 is a MISR implementation of the preferred embodiment of the present invention. Thus, if XOR 55 is inserted between AND 44 and XOR 54 of FIG. 2, a new XOR Network 140 will emerge, as shown in FIG. 6. This new network together with Data Register 90 behaves in a manner equivalent to the MISR of FIG. 5. Although for illustration only two inputs are shown (Data In 1 and Data In 2), the number of inputs could be incremented up to the number N of stages in the shift register.

The XOR Network 140 will accept the present state of the LFSR in a manner similar to XOR Network 70 and generate the next state (in this case, the next signature of the multiple inputs). As illustrated for the four XOR Network POLFSR, if more than one XOR Network is connected in series, it becomes possible to generate more than one new state during a single clock cycle.

Figure 7:
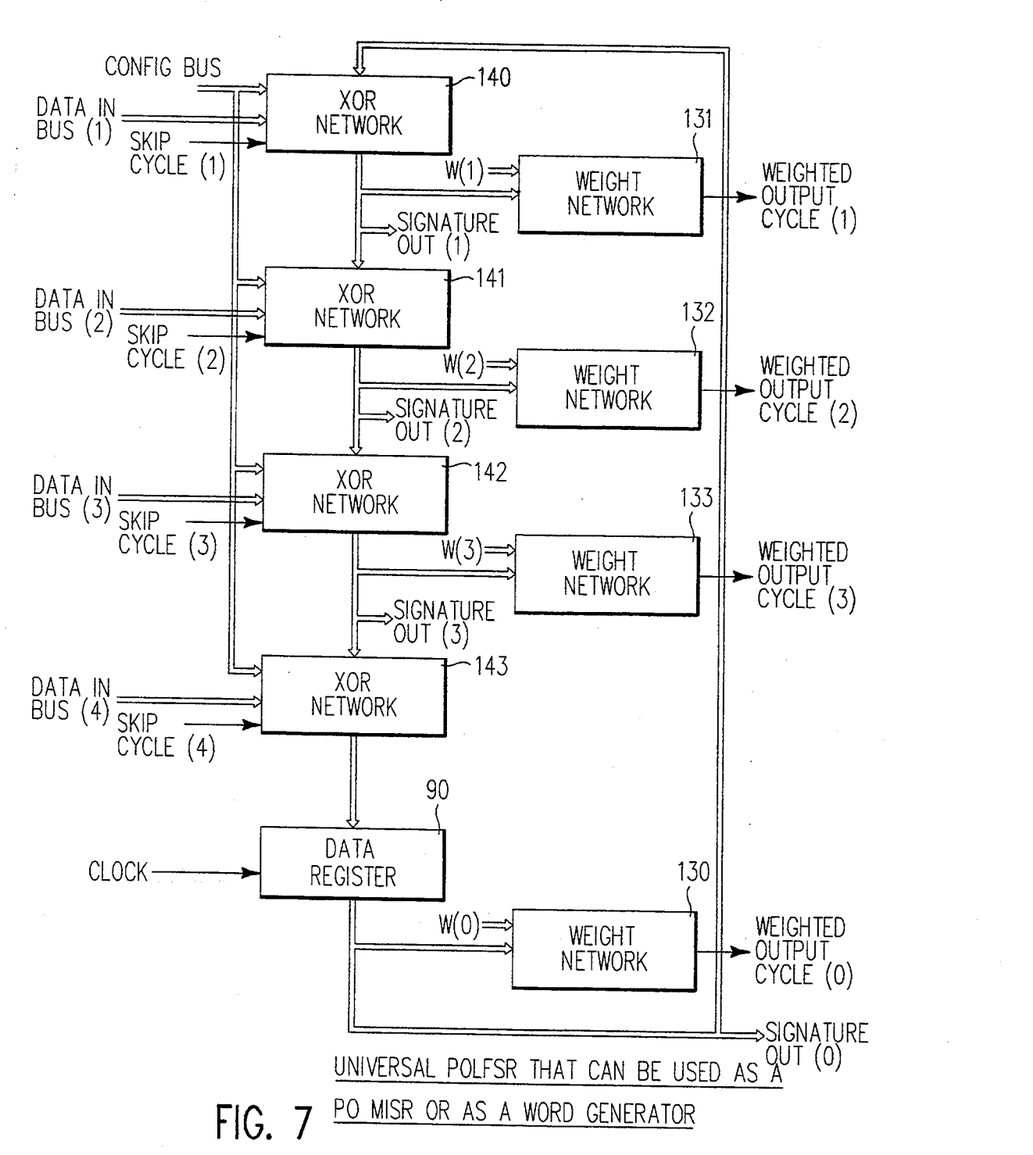
FIG. 7 is a block diagram of a universal parallel operation LFSR that runs as a parallel operation MISR or as a WRP generator, in accordance with the present invention.

For the Universal POLFSR of FIG. 7, the same Config Bus feeds all the XOR Networks because the general configuration remains unchanged during the complete test. The Data In Bus, on the other hand, is broken up into M segments, each segment representing the input data for different cycles of the DUT response. For simplicity, consider a single input source of data into the POLFSR. This input, emerging from the DUT undergoes a serial to parallel conversion. The converter will have M outputs, in which each output feeds a different XOR Network. This is required because each XOR network operates on a different response cycle of the DUT. In the case of the MISR, each of the inputs of the MISR has to go through an M stage serial to parallel converter producing the M Data In Busses shown in FIG. 7. The width of each bus is the same and is equal to the number of data inputs of the MISR. As in the case of the single input discussed above, each of the Data In Busses represents a different DUT response cycle.

It can be seen from the previous discussion that one DUT cycle after applying the Clock to Data Register 90, XOR Network 140 will produce the signature of the DUT response. This is accomplished by XOR Network 140 that combines the Signature Out (0) with Data In (1) based on the Config Bus status and instruction (i.e., if cycle 1 is to be skipped (Skip Cycle (1)). This Signature Out (1) data is now the input to XOR Network 141, which combines it with Data In Bus (2), again with the Config Bus command and instruction on the Skip CYCLE (2). This process is repeated M times, with the last signature feeding into the Data Register 90 which is timed by Clock and which starts the M DUT cycle sequence over again.

If the POLFSR is to be used for generating random patterns, then all the lines of all the Data In busses are held constant (normally at "0"), and the various Signature Out busses will contain the random data needed to drive the DUT. For straight forward random pattern generation, the same one bit of each signature would be used so that the M signatures would represent M DUT cycles. On the other hand, if the POLFSR is to be used for weighted random pattern generation, then a selection of bits from each of the Signature Out busses will feed the weighting network previously described. Each of these weighting networks has its own control bus that allows a cycle by cycle control of the weight. In this manner, the M weighting networks operating on the M Signature Out busses produce M Weighted Outputs to be applied to the DUT. Since the outputs are produced in parallel, a parallel to serial conversion would be required before the data is applied to the DUT.

As previously mentioned in connection with FIG. 2, the proper operation of an LFSR requires a starting seed. This can be accomplished for the POLFSR, as in the case of the LFSR, in one of two methods. The first is by holding the Config Bus at all "0"s, and shifting in a pattern through the Data In Bus. An alternate method (not illustrated) is to introduce a set of multiplexers between XOR Network 143 and Data Register 90 in FIG. 7. These Multiplexers will allow introducing the seed data with a single application of the Clock.

Although this invention has been described by reference to particular embodiments thereof, many changes and modifications of the invention will become apparent to those skilled in the art without departing from the spirit and scope of the invention. Therefore, it is intended that the appended claims shall be construed to include the preferred embodiments and all such variations and modifications in form and detail that shall fall within the spirit and scope of the invention.

What is claimed is:

1. A Linear Feedback Shift Register (LFSR) for generating random test patterns, comprising:
   register means for storing data, said register means comprising a plurality of latches, wherein at least one of said latches is driven by a clock;
   a plurality of sequentially connected, functionally equivalent combinatorial logic networks, one of said networks driving said register means, said register means driving a second of said networks to provide a feedback path;
   parallel driving means for driving a parallel pattern at an output bus responsive to psuedo-random patterns generated by said networks; and
   configuration means inputted to said combinatorial logic networks for reconfiguring said combinatorial logic network that generates said pseudo-random patterns.

2. The LFSR according to claim 1, further comprising input control means inputted to said combinatorial logic networks for controlling said generated pseudo-random patterns, whereby the number of said patterns generated during a clock cycle is reduced.

3. The LFSR according to claim 1, further comprising weighting means responsive to said combinatorial logic networks for weighting said pseudo-random patterns.

4. A Multiple Input Shift Register (MISR) for generating a signature from a plurality of data-in signals, comprising:
   register means for storing data, said register means comprising a plurality of latches, wherein at least one of said latches is driven by a clock;
   a plurality of sequentially connected, functional equivalent combinatorial logic networks, one of said networks driving said register means, said register means driving a second of said networks to provide a feedback path, each of said networks generating a signature; and
   means for receiving a plurality of data-in signals at each of said combinatorial logic networks and for receiving one of said generated signatures, such that one of said generated signatures is combined with said data-in signals to generate a new signature.

5. The MISR according to claim 4, further comprising input control means for controlling data-in signals received at an input bus of said combinatorial logic networks, whereby the number of said signatures generated during a clock cycle is reduced.

6. The MISR according to claim 4, further comprising configuration means inputted to said combinatorial logic networks for reconfiguring said combinatorial logic network that generates said signature.

7. A Linear Feedback Shift Register (LFSR) for generating random test patterns, comprising:
   a register for storing data, said register comprising a plurality of latches, wherein each said latch is driven by an external clock;
   a plurality of multiplexers (MUXs), each of said MUXs drives one said latch and is provided with two data and one control inputs, the first of said data inputs is a feedback line linking the output of the latch said MUX is driving back into said MUX to inhibit data stored in said latch from being altered, and said control input for providing a signal that selects which data is to appear at the output of said MUX;

a plurality of exclusive-OR circuits (XORs), which number equals the number of said latches, wherein each said XORs subsequent to the first said XORs links one said latches to the next adjacent one via a first data input, wherein the output of each said XORs is connected to the second said two data inputs of said MUX to maintain normal operation of the LFSR, and wherein the first input of the first said XORs for providing data to the first said latches; and a plurality of dual input AND gates which number is equal to the number of XORs, wherein the output of each said AND gates is connected to said second data input of said XOR, the first of said dual inputs of each said AND gates is connected to the output of the last stage of said register, and the second said dual inputs is respectively connected to one of a plurality of external lines, wherein binary values on said external lines dynamically reconfigure the LSFR by selectively adding a signal from said output of said last latch of said register.

8. The LFSR according to claim 7, further combining said AND gates, XORs and MUXs into a four-inputs and one output XOR Network, said output is comprised of the outputs of said MUXs, the first of said inputs is comprised of the outputs of said register, the second of said inputs is an external skip-cycle line, the third of said inputs is comprised by external configuration lines and the fourth of said inputs provides data to said XOR Network, whereby said skip-cycle line inhibits said XOR network from modifying test data in said register.

9. The LFSR according to claim 7, further comprising said register connected to a weighting network for generating weighted random test patterns.

10. The LFSR according to claim 8, further comprising a plurality of sequentially connected said XOR Networks, wherein one said XOR Networks drives said data register, said data register feeds back into a second of said XOR Networks, and wherein each said XOR Networks are provided data with a configuration input, skip-cycle input and data input, thereby converting the LFSR mode of operation to parallel operation.

11. The LFSR according to claim 9, further comprising a weighting network connected to each said XOR Networks for weighting said patterns.

12. A Linear Feedback Shift Register (LFSR) provided with fixed configuration capabilities, comprising:

a register for storing data, comprising a plurality of latches, wherein each said latch is driven by an external clock;

a plurality of multiplexer circuits (MUXs), each said MUXs drives one of said latches and is provided with two data and one control inputs, the first of said data inputs is a feedback line tying the output of the latch said MUX is driving back into said MUX to inhibit test data stored in said latch from being altered, and said control input is a line for providing a signal that selects which data input will appear at the output of said MUX;

a plurality of exclusive-OR circuits (XORs), in which the number of said XORs is less than the number of said latches in said register, wherein each said XORs links one said latches to the next adjacent one via a first data input, the output of the last said latches of said register provides a second data input to each said XORs, wherein the output of each said XORs is connected to the second said two data inputs of said MUX to maintain normal operation of the LFSR, wherein the second input of the first said MUXs is provided by the output of the last said latches, and such that in the absence of one of said XORs connected to one of said MUXs, the output of the previous latch in said register is directly connected to said second data input of said MUX so that test data stored in each of said latches is selectively modified when test data shifts from one of said latches to the next one.

13. The LFSR according to claim 12, further comprising said XORs and MUXs correspondingly combined to form a three input, one output XOR Network, said output is comprised of the outputs of said MUXs, the first input is comprised of the outputs of said register, the second of said inputs providing data to said XOR Network, and the third of said inputs is provided by the external skip-cycle line which inhibits the altering of test data in said register.

14. The LFSR according to claim 13, further comprising weighting means responsive to said XOR Network for generating weighted random patterns.

15. The LFSR according to claim 13, further comprising a plurality of sequentially connected said XOR Networks, wherein one said XOR Networks drives said register, said register feeds back into a second of said XOR Networks, and wherein said XOR Networks are provided each with inputs, comprising a configuration input, and a skip-cycle input, whereby converting the LFSR mode of operation to parallel mode.

16. The LFSR according to claim 15, wherein each said XOR Networks is connected to a weighting network for providing weighted random patterns.

17. A Multiple Input Shift Register (MISR) for generating a signature from plural data-in signals, comprising:

a register for storing data, said register comprising a plurality of latches, wherein each said latch is driven by an external clock;

a plurality of multiplexer circuits (MUXs), each said MUXs drives one of said latches and is provided with two data and one control inputs, the first of said data inputs is a feedback line linking the output of the latch said MUX is driving back into said MUX to inhibit test data stored in said latch from being altered, and said control input for providing a signal that selects which data input will appear at the output of said MUX;

a plurality of exclusive-OR circuits (XORs), which number equals the number of said latches, for generating a signature, wherein each said XORs subsequent to the first said XORs links one said latches to the next adjacent one via a first data input, wherein the output of each said XORs is connected to the second said two data inputs of said MUX to maintain normal operation of the MISR, wherein the first input of the first said XORs provides data to the first said latches, and wherein at least one of said XORs is provided with a third input for providing data; and a plurality of dual input AND gates which number is equal to the number of XORs, such that the output of each said AND gates is connected to said second data input of said XOR, the first of said dual inputs of each said AND gates is connected to the output of the last stage of said register, and the second said dual inputs is respectively connected to a line, wherein a binary value on said line dynamically reconfigures the MISR by selectively adding a signal from said output of said last latch of said register.

18. The MISR according to claim 17, further comprising said AND gates, XORs and MUXs correspondingly combined into a four inputs, one output XOR Network, said output is comprised of the outputs of said MUXs, the first input is comprised of the outputs of said register, the second of said inputs providing data to said XOR Network, the third of said inputs is comprised of external configuration lines, and the fourth of said inputs is the skip-cycle line which inhibits the altering of said signature.

19. The MISR according to claim 18, further comprising a plurality of said XOR Networks sequentially connected, wherein one said XOR Networks drives said data register means, said data register means feeds back into a second of said XOR Networks, and wherein said XOR Networks are additionally provided each with a configuration input, a skip-cycle input and data inputs, whereby converting the MISR mode of operation to a parallel mode.

* * * * *